United States Patent
Nishi et al.

(10) Patent No.: US 9,929,377 B2
(45) Date of Patent: Mar. 27, 2018

(54) ARRANGEMENT OF SEALING MATERIALS FOR DISPLAY DEVICE

(71) Applicant: Semiconductor Energy Laboratory Co., Ltd., Atsugi-shi, Kanagawa-ken (JP)

(72) Inventors: Takeshi Nishi, Kanagawa (JP); Yasuo Nakamura, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/460,319

(22) Filed: Mar. 16, 2017

(65) Prior Publication Data
US 2017/0186998 A1  Jun. 29, 2017

Related U.S. Application Data

(60) Continuation of application No. 14/569,872, filed on Dec. 15, 2014, now Pat. No. 9,601,712, which is a (Continued)

(30) Foreign Application Priority Data

Jul. 5, 2002  (JP) ................................. 2002-197424

(51) Int. Cl.
H01L 51/52  (2006.01)
H01L 51/00  (2006.01)
H01L 27/32  (2006.01)

(52) U.S. Cl.
CPC ...... *H01L 51/5253* (2013.01); *H01L 51/0024* (2013.01); *H01L 51/5221* (2013.01);
(Continued)

(58) Field of Classification Search
CPC ........................ H01L 51/0024; H01L 51/5246
See application file for complete search history.

(56) References Cited

U.S. PATENT DOCUMENTS

| 4,647,337 A | 3/1987 | Simopoulos et al. |
| 4,691,995 A | 9/1987 | Yamazaki et al. |
(Continued)

FOREIGN PATENT DOCUMENTS

| CN | 001293802 A | 5/2001 |
| EP | 0822603 A | 2/1998 |
(Continued)

OTHER PUBLICATIONS

Chinese Office Action (Application No. 201210146133.0) dated Apr. 24, 2014.

*Primary Examiner* — Evan Pert
(74) *Attorney, Agent, or Firm* — Fish & Richardson P.C.

(57) ABSTRACT

A light emitting device having a structure in which oxygen and moisture are prevented from reaching light emitting elements, and a method of manufacturing the same, are provided. Further, the light emitting elements are sealed by using a small number of process steps, without enclosing a drying agent. The present invention has a top surface emission structure. A substrate on which the light emitting elements are formed is bonded to a transparent sealing substrate. The structure is one in which a transparent second sealing material covers the entire surface of a pixel region when bonding the two substrates, and a first sealing material (having a higher viscosity than the second sealing material), which contains a gap material (filler, fine particles, or the like) for protecting a gap between the two substrates, surrounds the pixel region. The two substrates are sealed by the first sealing material and the second sealing material. Further, reaction between electrodes of the light emitting elements (cathodes or anodes) and the sealing materials can be
(Continued)

prevented by covering the electrodes with a transparent protective layer, for example, $CaF_2$, $MgF_2$, or $BaF_2$.

30 Claims, 11 Drawing Sheets

Related U.S. Application Data division of application No. 13/906,577, filed on May 31, 2013, now Pat. No. 8,927,979, which is a division of application No. 13/188,513, filed on Jul. 22, 2011, now Pat. No. 8,455,916, which is a continuation of application No. 12/726,429, filed on Mar. 18, 2010, now Pat. No. 7,985,606, which is a division of application No. 10/465,877, filed on Jun. 20, 2003, now Pat. No. 7,700,958.

(52) U.S. Cl.
CPC ...... *H01L 51/5246* (2013.01); *H01L 27/3244* (2013.01); *H01L 2251/5315* (2013.01); *H01L 2251/5323* (2013.01)

(56) References Cited

U.S. PATENT DOCUMENTS

| | | | |
|---|---|---|---|
| 5,148,301 A | 9/1992 | Sawatsubashi et al. | |
| 5,194,027 A | 3/1993 | Kruskopf et al. | |
| 5,776,622 A | 7/1998 | Hung et al. | |
| 5,882,761 A | 3/1999 | Kawami et al. | |
| 5,978,065 A | 11/1999 | Kawasumi et al. | |
| 6,078,379 A | 6/2000 | Nagae et al. | |
| 6,111,357 A | 8/2000 | Fleming et al. | |
| 6,128,056 A * | 10/2000 | Kubota | G02F 1/1334 349/86 |
| 6,274,887 B1 | 8/2001 | Yamazaki et al. | |
| 6,317,186 B1 | 11/2001 | Miwa et al. | |
| 6,433,358 B1 | 8/2002 | Beierlein | |
| 6,473,148 B1 | 10/2002 | Suh | |
| 6,512,271 B1 | 1/2003 | Yamazaki et al. | |
| 6,559,594 B2 | 5/2003 | Fukunaga et al. | |
| 6,573,957 B1 | 6/2003 | Suzuki | |
| 6,586,496 B1 | 7/2003 | Takamatsu et al. | |
| 6,614,076 B2 | 9/2003 | Kawasaki et al. | |
| 6,617,052 B2 | 9/2003 | Morii | |
| 6,624,572 B1 | 9/2003 | Kim et al. | |
| 6,624,870 B1 | 9/2003 | Greene et al. | |
| 6,635,989 B1 | 10/2003 | Nilsson et al. | |
| 6,636,192 B1 | 10/2003 | Saitoh | |
| 6,657,698 B1 | 12/2003 | Greene et al. | |
| 6,677,620 B2 | 1/2004 | Ishii et al. | |
| 6,696,786 B2 | 2/2004 | Burrows | |
| 6,771,347 B2 | 8/2004 | Hirakata | |
| 6,791,660 B1 | 9/2004 | Hayashi et al. | |
| 6,806,641 B2 | 10/2004 | Ueda et al. | |
| 6,819,391 B2 | 11/2004 | Kim et al. | |
| 6,839,122 B2 | 1/2005 | Chung et al. | |
| 6,886,243 B2 * | 5/2005 | Ishikawa | G09F 9/30 174/254 |
| 6,995,893 B2 * | 2/2006 | Kobayashi | H01L 51/5246 257/433 |
| 7,011,562 B2 | 3/2006 | Kim et al. | |
| 7,109,655 B2 | 9/2006 | Kurihara | |
| 7,112,115 B1 | 9/2006 | Yamazaki et al. | |
| 7,128,632 B2 * | 10/2006 | Nakamura | H01L 51/5253 313/512 |
| 7,169,636 B2 | 1/2007 | Maruyama et al. | |
| 7,176,624 B2 | 2/2007 | Kim et al. | |
| 7,196,763 B2 | 3/2007 | Park et al. | |
| 7,208,868 B2 | 4/2007 | Ueda et al. | |
| 7,256,859 B2 | 8/2007 | Kim et al. | |
| 7,317,281 B2 | 1/2008 | Hayashi et al. | |
| 7,569,859 B2 | 8/2009 | Maruyama et al. | |
| 7,663,314 B2 | 2/2010 | Kim et al. | |
| 7,679,708 B2 | 3/2010 | Momose et al. | |
| 7,700,958 B2 * | 4/2010 | Nishi | H01L 27/322 257/100 |
| 7,985,606 B2 | 7/2011 | Nishi et al. | |
| 8,455,916 B2 * | 6/2013 | Nishi | H01L 27/322 257/100 |
| 8,659,516 B2 | 2/2014 | Koyama | |
| 9,601,712 B2 * | 3/2017 | Nishi | H01L 27/322 |
| 2002/0033664 A1 | 3/2002 | Kobayashi | |
| 2002/0039730 A1 | 4/2002 | Morii | |
| 2002/0047555 A1 | 4/2002 | Inukai | |
| 2002/0060768 A1 | 5/2002 | Chung et al. | |
| 2002/0131008 A1 * | 9/2002 | Iwase | H01L 51/5246 349/153 |
| 2003/0179336 A1 | 9/2003 | Ryu et al. | |
| 2004/0004434 A1 * | 1/2004 | Nishi | H01L 27/322 313/506 |
| 2004/0100601 A1 | 5/2004 | Iwase et al. | |
| 2004/0121602 A1 | 6/2004 | Maruyama et al. | |
| 2004/0152392 A1 * | 8/2004 | Nakamura | H01L 51/5253 445/25 |
| 2004/0245541 A1 | 12/2004 | Shitagaki et al. | |
| 2006/0103303 A1 | 5/2006 | Kim et al. | |
| 2007/0018566 A1 | 1/2007 | Yamazaki et al. | |
| 2007/0040492 A1 | 2/2007 | Nakamura | |
| 2007/0052347 A1 | 3/2007 | Kurihara | |
| 2007/0120132 A1 | 5/2007 | Maruyama et al. | |
| 2010/0326592 A1 | 12/2010 | Ishitani et al. | |
| 2013/0250227 A1 * | 9/2013 | Kira | G02F 1/1339 349/153 |

FOREIGN PATENT DOCUMENTS

| | | | |
|---|---|---|---|
| EP | 1134817 A | 9/2001 | |
| EP | 1361556 A | 11/2003 | |
| JP | 61-003954 A | 1/1986 | |
| JP | 64-054420 A | 3/1989 | |
| JP | 04-212284 A | 8/1992 | |
| JP | 04-267097 A | 9/1992 | |
| JP | 05-005890 A | 1/1993 | |
| JP | 05-198375 A | 8/1993 | |
| JP | 06-176867 A | 6/1994 | |
| JP | 08-124677 A | 5/1996 | |
| JP | 08-146441 A | 6/1996 | |
| JP | 10-074586 A | 3/1998 | |
| JP | 2776040 | 5/1998 | |
| JP | 10-275680 A | 10/1998 | |
| JP | 2000-30858 | * 1/2000 | ......... H01L 51/5246 |
| JP | 2000-068050 A | 3/2000 | |
| JP | 2000-150145 A | 5/2000 | |
| JP | 2001-133795 A | 5/2001 | |
| JP | 2001-185348 A | 7/2001 | |
| JP | 2001-267083 A | 9/2001 | |
| JP | 2001-338755 A | 12/2001 | |
| JP | 2001-338771 A | 12/2001 | |
| JP | 2001-345175 A | 12/2001 | |
| JP | 2001-357973 A | 12/2001 | |
| JP | 2002-025764 A | 1/2002 | |
| JP | 2002-134272 A | 5/2002 | |
| JP | 2002-216950 A | 8/2002 | |
| JP | 2003-108038 A | 4/2003 | |
| JP | 2003-243161 A | 8/2003 | |
| JP | 2004-022277 A | 1/2004 | |
| KR | 2001-0083584 A | 9/2001 | |
| KR | 2002-0014368 A | 2/2002 | |
| WO | WO-2004/060021 | 7/2004 | |
| WO | WO-2004/060022 | 7/2004 | |

* cited by examiner

SUBSTRATE CUTTING LINE

SPREAD DIRECTION
OF SECOND SEAL
MATERIAL

FIG. 3A

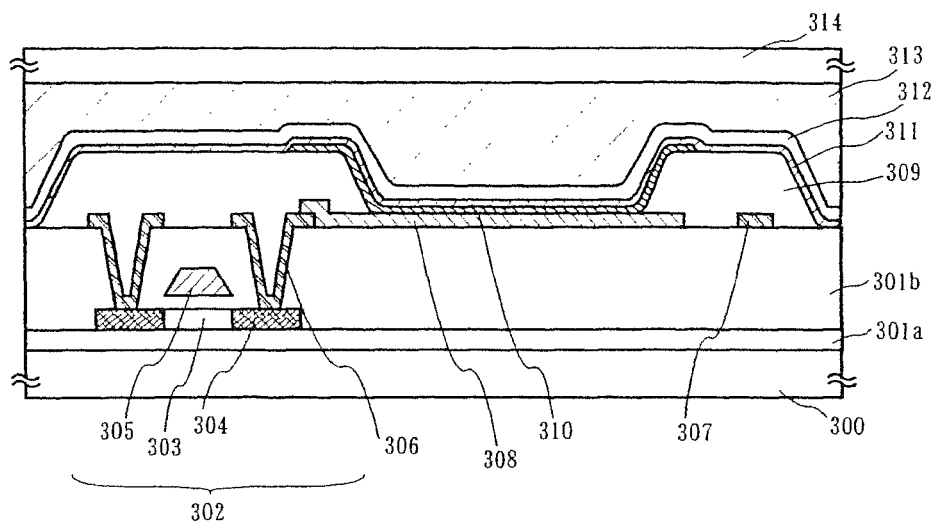

FIG. 3B

| 314: second substrate |
| 313: second seal material |
| 312: transparent protective layer |
| 311: metal film (second electrode) |
| 310: E L layer |
| 308: metal layer (first electrode) |
| 301: insulating layer |
| 300: first substrate |

FIG. 3C

| 314: second substrate |
| 313: second seal material |
| 312: transparent protective layer |
| 311: metal film (second electrode) |
| 310: E L layer |
| 318: tarnsparent conductive film (first electrode) |
| 301: insulating layer |
| 300: first substrate |

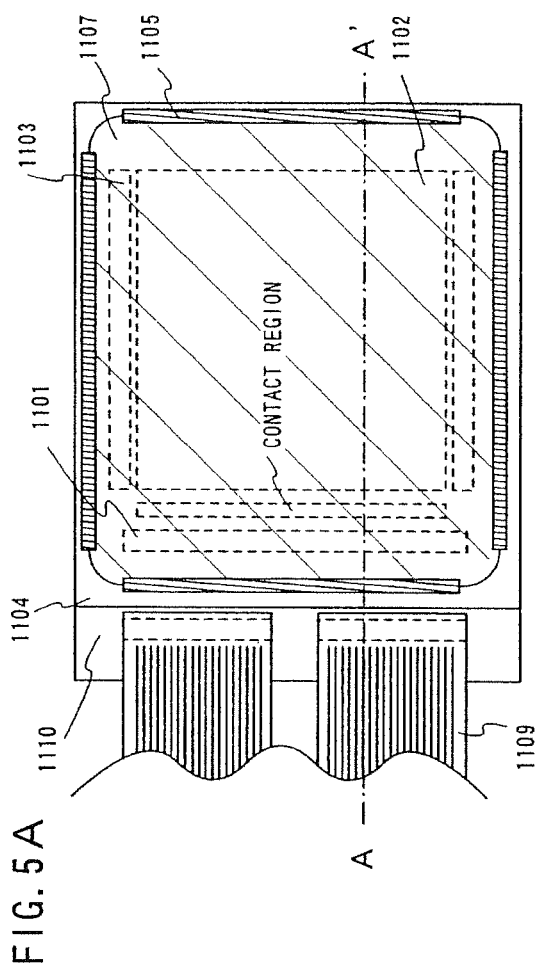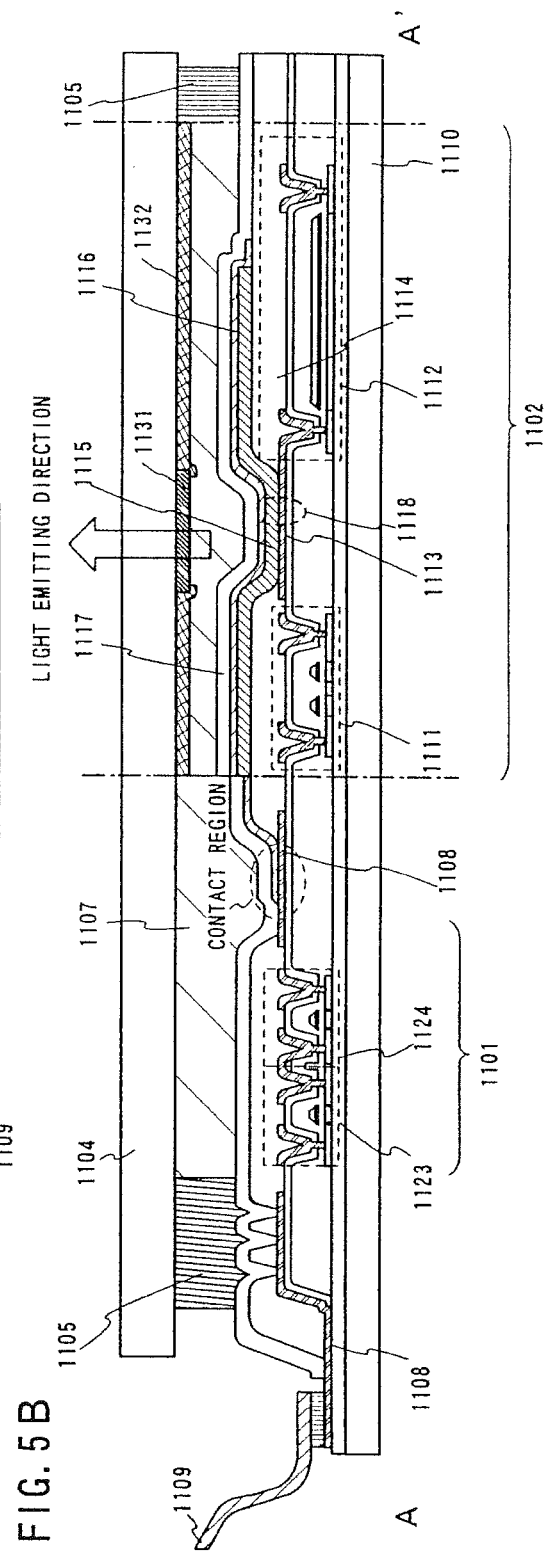

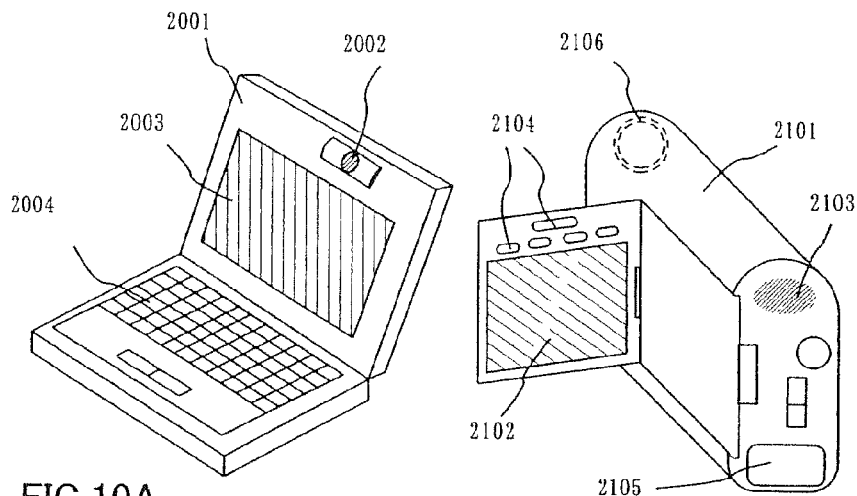
FIG.10A
FIG.10B
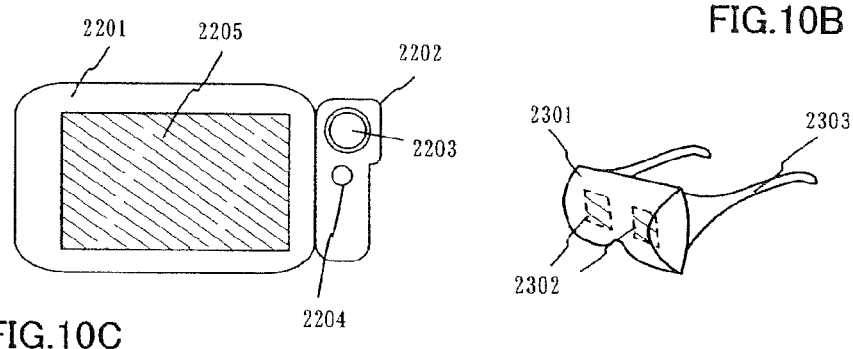
FIG.10C
FIG.10D
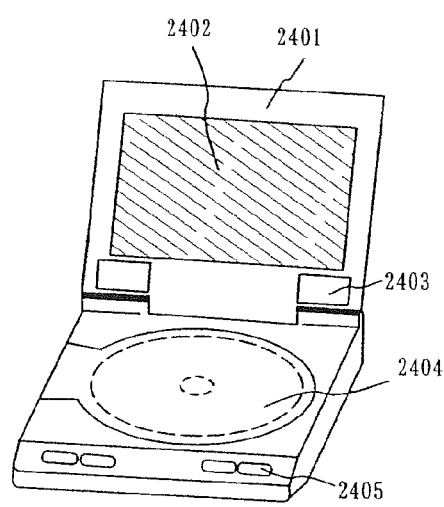
FIG.10E
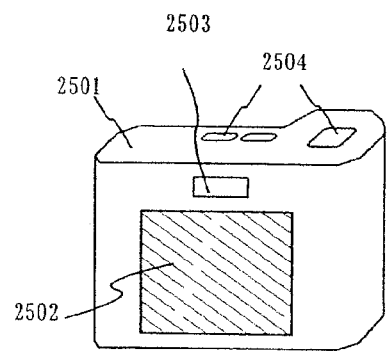
FIG.10F

ARRANGEMENT OF SEALING MATERIALS FOR DISPLAY DEVICE

CROSS-REFERENCE TO RELATED APPLICATIONS

This application is a continuation of U.S. application Ser. No. 14/569,872, filed Dec. 15, 2014, now allowed, which is a divisional of U.S. application Ser. No. 13/906,577, filed May 31, 2013, now U.S. Pat. No. 8,927,979, which is a divisional of U.S. application Ser. No. 13/188,513, filed Jul. 22, 2011, now U.S. Pat. No. 8,455,916, which is a continuation of U.S. application Ser. No. 12/726,429, filed Mar. 18, 2010, now U.S. Pat. No. 7,985,606, which is a divisional of U.S. application Ser. No. 10/465,877, filed Jun. 20, 2003, now U.S. Pat. No. 7,700,958, which claims the benefit of a foreign priority application filed in Japan as Serial No. 2002-197424 on Jul. 5, 2002, all of which are incorporated by reference.

BACKGROUND OF THE INVENTION

1. Field of the Invention

The present invention relates to a semiconductor device having a circuit composed of a thin film transistor (hereinafter, TFT) and a method for manufacturing the semiconductor device. In particular, the present invention relates to an electronic device onboard an electric optical device typified by a liquid crystal display panel and a light emitting display device having an organic compound light emitting layer as components.

A semiconductor device in this specification means comprehensive semiconductor devices such as an electric optical device, a semiconductor circuit, and an electronic device.

2. Description of the Related Art

In recent years, study of a light emitting device having an EL element as a self-luminous element has become vigorous. In particular, a light emitting device using an organic material as an EL material has attracted an attention. The light emitting device is also referred to as an EL display.

Note that an EL element includes a layer containing an organic compound that emits light by applying an electric field (hereinafter, an EL layer), an anode, and a cathode. Luminescence generated by an organic compound is fluorescence that generates upon returning of electrons from the singlet excited state to the ground state and phosphorescence that generates upon returning of electrons from the triplet excited state to the ground state. A light emitting device fabricated by a deposition device and a deposition method is applicable to both kinds of luminescence.

A light emitting device has no viewing angle difficulties for its self-luminous property differently from a liquid display device. Thus the light emitting device is more suitable for using at outside than the liquid crystal display device. Various types of usage have been proposed for the light emitting device.

An EL element has a structure in which a pair of electrodes sandwich an EL layer between each other, generally, a laminated structure. Typically, a laminated structure, "a hole transporting layer, a light emitting layer, an electron transporting layer" proposed by Tang et al. of Kodak Eastman Company is generally known. The structure has greatly high luminous efficiency and employed by almost all light emitting devices that are under development now.

Another structure such as "an anode, a hole transporting layer, a light emitting layer, and an electron transporting layer" or "an anode, a hole injecting layer, a hole transporting layer, a light emitting layer, an electron transporting layer, and an electron injecting layer" can be also applicable. Fluorescent pigments can be doped to the light emitting layer. For forming these layers, either a low molecular material or a high molecular material can be used.

In this specification, an EL layer is a generic term used to refer to all layers formed between a cathode and an anode. Therefore all of each the above-mentioned hole injecting layer, hole transporting layer, light emitting layer, electron transporting layer, electron injecting layer is an EL layer.

In this specification, a light emitting element that is formed by a cathode, an EL layer, and an anode is referred to as an EL element. There are two kinds for forming the EL element; a simple matrix that an EL layer is sandwiched between two kinds of striped electrodes that run at right angles to one another, or an active matrix that an EL layer is sandwiched between a pixel electrode and a counter electrode arranged in matrix that are connected to a TFT. When the pixel density is become high, it is considered that an active matrix has an advantage over a simple matrix because the active matrix can drive at low voltage for having switches in each pixel (or each dot).

Since an EL material is deterioratable resulted from being oxidized or absorbed due to oxygen or moisture, there has been a problem that the luminous efficiency of a light emitting element is decreased or the lifetime thereof is shorted.

Conventionally, oxygen or moisture is prevented from penetrating into a light emitting element by encapsulating the light emitting element using an encapsulating can, enclosing a dry air thereinto, and pasting drying agent to the encapsulating can.

The conventional light emitting has the structure that has a light emitting element in which an electrode on a substrate is formed as an anode, an organic compound layer is formed on the anode, and a cathode is formed on the organic compound layer, and light generated in the organic compound layer is emitted through the anode formed as a transparent electrode to a TFT (hereafter, the structure is referred to as a bottom emission).

Although an encapsulating can is possible to cover a light emitting element in above bottom emission structure, the structure that an electrode on a substrate is formed as an anode, an organic compound layer is formed on the anode, and a cathode is formed as a transparent electrode (hereinafter, the structure is referred to as a top emission) cannot use the encapsulating can that is made from a light shielding material. A drying agent on the pixel portion disturbs the display in the top emission structure. Further in order not to absorb, the drying agent requires careful handling and quick enclosing.

Compared to a bottom emission structure, a top emission structure requires few material layers through which light is emitted generated in an organic compound layer, and thereby can suppress stray light between material layers having different reflective index.

An object of the present invention is to provide a light emitting device and a method for forming the light emitting device through which oxygen or moisture is prevented from penetrating into a light emitting element. Another object of the present invention is to encapsulate the light emitting element with a few steps without enclosing drying agent.

The present invention has a top surface emission structure in which a substrate, with light emitting elements formed thereupon, is bonded to a transparent sealing substrate. A pixel region is covered over its entire surface by a transparent second scaling material when bonding the two substrates, and is surrounded by a first sealing material (having a higher viscosity than the second sealing material) that contains a gap material (filler, fine particles, or the like) for maintaining a gap between the two substrates. The first sealing material and the second sealing material thus seal the light emitting element.

There is a fear in that air bubbles will remain in corners if a seal pattern shape for the first sealing material is formed into a square shape, an inverted "c" shape, or a "U" shape, and the two substrates are bonded by dripping the low viscosity second sealing material thereon.

Therefore, in the present invention, a pattern shape of the first sealing material is formed into a pattern having no bent portion (line shape) without making the pattern shape into the square shape, the inverted "c" shape or the "U" shape. Opening portions (four locations) are formed in the corners, which allow air bubbles to escape therethrough. By forming the opening portions, the low viscosity second sealing material is pushed out in the direction of the opening portion of the corners when bonding the two substrates using the low viscosity second sealing material. The two substrates can thus be sealed without air bubbles mixing in on the pixel region. In addition, a pattern for the high viscosity first sealing material may be slightly curved so that air bubbles do not form. Further it is preferable that the substrate surfaces on the sealing side be smooth and have superior levelness so that bubbles do not mix in.

Further, there are cases in which a circumferential portion of the second sealing material will spread out from the opening portions (four locations), forming a bulging out shape (protruding shape), depending upon the viscosity of the second scaling material and the manner in which it is pushed out. There are also cases in which the circumferential portion of the second sealing material will form a shape that enters into the inside of the opening portions. Note that the adhesive strength between the two substrates can be increased in order to increase the contact adhesive surface area if there is provided a bulging out shape.

In either case, the high viscosity first scaling material functions to maintain the substrate gap through the gap material, and to adjust the planar shape of the low viscosity second sealing material. Further, the first sealing material can also serve as a mark when sectioning the substrate. For example, the substrate may be sectioned along the first sealing material when manufacturing a plurality of panels on one substrate, that is, in the case of so-called multiple patterns.

Further, a location of maximum load applied when a shock is received from the outside can be set to the location of the first sealing material (only the first sealing material has the gap material) disposed outside of the pixel region, and the load can be prevented from being applied to the pixel region. Further, this is a structure in which the first sealing materials are symmetrically disposed, and loads are applied uniformly and with a good balance. Shocks from the outside can therefore be uniformly diffused. Further, the first sealing materials have a symmetrical shape, and are disposed symmetrically, and therefore a very constant substrate gap can be maintained. That is, a light emitting device having an even more robust mechanical strength can be made by using the structure of the present invention.

Further, it is desirable that the substrate, through which light emitted from the light emitting elements passes, be thin for the top surface emission structure. Thin substrates have a disadvantage, however, in that they are weak with respect to shocks. Nonetheless, a light emitting device capable of withstanding shocks form the outside can be made in accordance with the present invention, even if a glass substrate or the like, which tends to break relatively easily, is used as the substrate through which light emitted from the light emitting elements passes. Further, there are no particular limitations placed on the transparent substrate used, and plastic substrates and the like can be used, for example. It is preferable that a pair of substrates use substrates having the same thermal expansion coefficient in order to maintain the adhesive strength.

Further, by making the seal pattern of the first sealing material into a simple shape, other seal pattern forming methods can also be used, such as a printing method, for example, in addition to a dispenser apparatus.

Further, the light emitting elements are sealed by the first scaling material, the second sealing material, and the substrates, and therefore moisture and oxygen can be effectively blocked. Note that it is desirable to perform bonding of the pair of substrates under a reduced pressure or in a nitrogen atmosphere.

According to an aspect of the invention disclosed in this specification, there is provided a light emitting device including a pixel portion having a plurality of light emitting elements between a pair of substrates, at least one of which has transmittivity, the light emitting elements each having:
 a first electrode;
 an organic compound layer on and in contact with the first electrode; and
 a second electrode on and in contact with the organic compound layer;
 characterized in that:
 the pair of substrates are fixed by a first sealing material disposed surrounding the pixel portion, and a second sealing material in contact with the first scaling material and covering the pixel portion; and
 the first sealing material has openings in four corners.

In the structure described above, it is characterized in that the first sealing material has a linear shape and is disposed in the plane of the substrate, in parallel with an x-direction or a y-direction.

Further, in the structure described above, it is characterized in that the second sealing material is exposed by the openings, and the circumference of the exposed second sealing material is curved, as shown by FIGS. 1A to 1C. A structure may also be adopted in which the second sealing material is exposed at the openings, and the circumference of the exposed second sealing material protrudes from the openings as shown in FIG. 1A. Alternatively, a structure may also be adopted in which the second sealing material is exposed at the openings, and the circumference of the exposed second sealing material is depressed inwardly from the opening portions, as shown in FIG. 1C.

Further, according to another aspect of the present invention, there is provided a light emitting device including a pixel portion having a plurality of light emitting elements between a pair of substrates, at least one of which has transmittivity, the light emitting elements each having:
 a first electrode;
 an organic compound layer on and in contact with the first electrode; and
 a second electrode on and in contact with the organic compound layer;
 characterized in that:
 a pair of first scaling materials sandwiching the pixel portion are disposed in an x-direction, and another pair of the first sealing materials are disposed in a y-direction;

a second scaling material fills a space between at least one pair of the first scaling materials; and the shape of the second sealing material has bilateral symmetry, and is not limited to a linear shape provided that the second sealing material is disposed symmetrically sandwiching the pixel portion.

Further, in each of the structures described above, the first sealing material contains a gap material that maintains a gap between the pair of substrates.

Further, in each of the structures described above, it is characterized in that the second scaling material has higher transparency than the first scaling material.

Further, in each of the structures described above, it is characterized in that the film thickness of the second electrode is from 1 nm to 10 nm.

Further, in each of the structures described above, it is characterized in that there is provided a protective layer having transparency and made from $CaF_2$, $MgF_2$, or $BaF_2$, between the second electrode and the second sealing material.

Further, each of the structures described above is a light emitting device characterized in that light emitted from the light emitting elements is discharged through the second sealing material and one of the substrates.

Furthermore, the present invention can also be applied to double sided light emitting elements. In this case, each of the structures described above becomes a light emitting device characterized in that light emitted from the light emitting elements includes: emitted light that is discharged through the second sealing material and one of the substrates; and emitted light that is discharged through the other substrate.

Further, according to another aspect of the present invention in order to realize each of the structures described above, there is provided a method of manufacturing a light emitting device characterized by including the steps of:

forming one pair of first sealing materials on a first substrate in an x-direction, and one pair of the first sealing materials in a y-direction, opening a gap between each pair of the first sealing materials, for a total of four of the first sealing materials;

dripping a second sealing material having transparency onto a region surrounded by the first scaling materials;

spreading out the second sealing material so that it fills at least a space between mutually opposing first sealing materials when bonding the first substrate and a second substrate, upon which a pixel portion provided with light emitting elements is formed, so that the pixel portion is disposed in a region surrounded by the first scaling materials; and curing the first sealing materials and the second sealing material.

Further, according to another aspect of the present invention in order to realize the top surface structure of FIG. 1A, there is provided a method of manufacturing a light emitting device characterized by including the steps of:

forming one pair of first sealing materials on a first substrate in an x-direction, and one pair of the first sealing materials in a y-direction, opening a gap between each pair of the first sealing materials, for a total of four of the first sealing materials;

dripping a second sealing material having transparency onto a region surrounded by the first scaling materials;

spreading out the second scaling material so that it protrudes out from between adjacent first sealing materials when bonding the first substrate and a second substrate, upon which a pixel portion provided with light emitting elements is formed, so that the pixel portion is disposed in a region surrounded by the first scaling materials; and curing the first sealing materials and the second sealing material.

Further, a first sealing material and a second scaling material may also be formed on a second substrate, upon which a pixel portion is formed. According to another aspect of the present invention relating to a manufacturing method therefor, there is provided a method of manufacturing a semiconductor device characterized by including the steps of:

forming one pair of first sealing materials on a first substrate, upon which a pixel portion provided with light emitting elements is formed, in an x-direction, and one pair of the first sealing materials in a y-direction, opening a gap between each pair of the first sealing materials, for a total of four of the first sealing materials so as to surround the pixel portion;

dripping a second sealing material having transparency onto the pixel portion;

spreading out the second sealing material so that it fills at least a space between mutually opposing first sealing materials when bonding the first substrate and the second substrate; and curing the first sealing materials and the second sealing material.

In the structures relating to each of the manufacturing methods described above, the step of curing the first sealing materials and the second sealing material is a step of irradiating ultraviolet light or a step of heat treatment.

Further, in the structures relating to each of the manufacturing methods described above, it is characterized in that the second sealing material have a low viscosity than the first sealing material.

Further, in the structures relating to each of the manufacturing methods described above, it is characterized in that there is a further step of sectioning the first substrate and the second substrate along the first sealing materials after curing the first sealing materials and the second scaling material.

Further, although a metallic film having a thin film thickness and through which light passes, typically a film having aluminum as its main constituent, is used as the second electrode (cathode or anode) in the present invention, metallic thin films tend to easily oxidize, resulting in increasing their electrical resistance value. Further, there is a fear in that the second electrode will react with the constituents contained in the sealing materials. It is therefore desirable to cover the second electrode (cathode or anode), which is formed on a layer that contains organic compounds, by using a transparent protective film of $CaF_2$, $MgF_2$, or $BaF_2$, for example, thus preventing reaction between the second electrode and the sealing materials, and also effectively blocking oxygen and moisture without using a drying agent. Further, it is possible to form $CaF_2$, $MgF_2$, and $BaF_2$ by evaporation. Impurities can be prevented from mixing in, and the electrode surfaces can be prevented from being exposed to the ambient atmosphere, by forming the cathode and the transparent protective layer in succession by evaporation. Further, $CaF_2$, $MgF_2$, and $BaF_2$ are stable materials as compared with LiF, do not diffuse to TFTs to exert almost no adverse influence.

Further, a region between the first electrode and the second electrode can maintain a non-oxygen state with a concentration as close to zero as possible, by using a metal (high work function material) having no oxygen atoms in its molecular structure, a tantalum nitride film, for example, as the first electrode, by using a metal (low work function material) having no oxygen atoms in its molecular structure, an aluminum thin film, for example, as the second electrode, and in addition, by covering these with $CaF_2$, $MgF_2$, or $BaF_2$.

Further, although there are no particular limitations placed on the material used as the second sealing material, provided that it is a highly transparent material, it is desirable to use a material that blocks oxygen and moisture. Further, ultraviolet light is also irradiated to the pixel portion during curing if an ultraviolet curing resin is used as the second sealing material. It is therefore desirable to form a layer that absorbs or reflects only ultraviolet light, ZnO or the like, for example, on the transparent protective film.

According to another aspect of the invention disclosed in this specification, there is provided a light emitting device including a pixel portion having a plurality of light emitting elements between a pair of substrates, at least one of which has transmittivity, the light emitting elements each having:

a first electrode;
a layer containing an organic compound on and in contact with the first electrode; and
a second electrode on and in contact with the layer containing an organic compound;
a protective layer having transparency on the second electrode and made from $CaF_2$, $MgF_2$, or $BaF_2$; and
a sealing material having transparency on the protective film;
characterized in that:
the first electrode is a laminate of metallic layers; and
the second electrode is made from a single layer of a metallic thin film having a film thickness of 1 nm to 10 nm.

The metallic thin film uses aluminum as its main constituent in the structure described above. In the laminate of metallic layers, the layer that contacts the layer containing the organic compound is a layer made from titanium nitride. Further, the metallic layer may also be a single layer composed of titanium nitride, instead of a laminate.

Further, in the structure described above, it is characterized in that the first electrode contacts a source region or a drain region of a TFT, or the first electrode is electrically connected to the source region or the drain region of the TFT.

Further, in the structure described above the metallic thin film is on and contacting a layer made from $CaF_2$, $MgF_2$, or $BaF_2$ that has a thinner film thickness than the metallic layer. In addition, there is a layer made from $CaF_2$, $MgF_2$, or $BaF_2$ on and contacting the metallic thin film, and having a thicker film thickness than the metallic thin film. That is, the metallic thin film is sandwiched and protected by the layers made from $CaF_2$, $MgF_2$, or $BaF_2$.

Further, in the structure described above, it is characterized in that the pair of substrates are fixed by a first scaling material disposed surrounding the pixel portion, and a second sealing materials that contacts the first scaling material and covers the pixel portion and the first sealing material has openings in its four corners.

Note that the light emitting elements (EL elements) have a layer (hereinafter referred to as an EL layer) that contains an organic compound, in which luminescence (electroluminescence) developing by adding an electric field is obtained, an anode, and a cathode. Light emission when returning to a base state from a singlet excitation state (fluorescence) and light emission when returning to a base state from a triplet excitation state (phosphorescence) exist as types of organic compound luminescence. Light emitting devices manufactured in accordance with the present invention can be applied to the use of either type of light emission.

The light emitting elements having the EL layer (EL elements) have a structure in which the EL layer is sandwiched between the pair of electrodes, and the EL layer normally has a laminate structure. The laminate structure of a hole transporting layer, a light emitting layer, and an electron transporting layer, that has been proposed by Tang et al. of Eastman Kodak Company can be given as a typical example. This structure has extremely high light emission efficiency, and nearly all light emitting devices undergoing research and development at present employ this structure.

Further, a structure in which a hole injecting layer, a hole transporting layer, a light emitting layer, and an electron transporting layer are laminated in order on an anode may also be used. A structure in which a hole injecting layer, a hole transporting layer, a light emitting layer, an electron transporting layer, and an electron injecting layer are laminated in order on an anode may also be used. A fluorescent pigment or the like may also be doped into the light emitting layer. Further, these layers may be formed by using all low molecular weight materials, and may also be formed by using all polymeric materials. Further, layers that contain inorganic materials may also be used. Note that all of the layers formed between the cathode and the anode are referred to generically as EL layers in this specification. Hole injecting layers, hole transporting layers, light emitting layers, electron transporting layers, and electron injecting layers are therefore all included in the category of EL layers.

Further, there are no particular limitations placed on a method of driving a screen display in the light emitting device of the present invention. For example, a dot sequential driving method, a line sequential driving method, a surface sequential driving method, or the like may be used. A line sequential driving method is typically used, and a time divided gray scale driving method or a surface area gray scale driving method may also be appropriately employed. Further, image signals input to a source line of the light emitting device may be analog signals and digital signals. Driving circuits and the like may be appropriately designed according to the image signals used.

BRIEF DESCRIPTION OF THE DRAWINGS

In the accompanying drawings:

FIGS. 3A and 3C are diagrams showing Embodiment Mode 2;

FIGS. 5A and 5B are diagrams showing a structure of an active matrix light emitting device (Embodiment 1);

FIGS. 10A to 10F are diagrams showing examples of electronic equipment (Embodiment 3)

DETAILED DESCRIPTION OF THE PREFERRED EMBODIMENTS

Embodiment modes of the present invention will be explained below.

Embodiment Mode 1

Figure 1A:
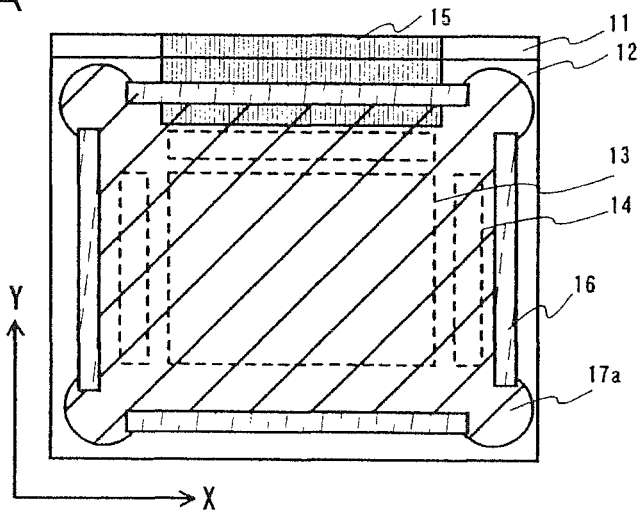
FIGS. 1A to 1C are diagrams showing Embodiment Mode 1.

FIG. 1A is a top view of an active matrix light emitting device that implements the present invention.

In FIG. 1A, reference numeral 11 denotes a first substrate, reference numeral 12 denotes a second substrate, reference numeral 13 denotes a pixel portion, reference numeral 14 denotes a driver circuit portion, reference numeral 15 denotes a terminal portion, reference numeral 16 denotes first sealing materials, and reference numeral 17a denotes a second sealing material.

There are no specific limitations placed on the material used for the first substrate 11. It is preferable, however, to use substrates having identical thermal expansion coefficients for the first substrate 11 and the second substrate 12 because the two substrates are bonded together. A substrate having transparency, for example, a glass substrate, a quartz substrate, or a plastic substrate, is used for the first substrate 11 material if a bottom surface emission light emitting device is manufactured. Further, a semiconductor substrate or a metallic substrate can also be used if a top surface emission light emitting device is manufactured. The pixel portion 13, which has a plurality of light emitting elements, the driver circuit portion 14, and the terminal portion 15 are formed on the first substrate 11.

An example in which the first sealing materials 16 are disposed surrounding the pixel portion 13 and the driver circuit portion 14 is shown here. Further, a portion of one of the first sealing materials 16 overlaps with the terminal portion 15 (or a wiring that extends from a terminal electrode). Note that the first sealing materials 16 contain a gap material in order to maintain a space between the pair of substrates. The first sealing materials 16 contain the gap material, and therefore it is preferable that the first sealing materials 16 do not overlap with elements (such as TFTs), so that shorts and the like do not develop when a load of some type is imparted. Further, the shape of the top surface of the first sealing materials is linear, and there are openings in four corners. In other words, two of the first sealing materials 16 are disposed in parallel in an x-direction, sandwiching the pixel portion, and two of the first sealing materials 16 are disposed in parallel in a y-direction, sandwiching the pixel portion. The total number of the first sealing materials disposed is four.

Further, the second sealing material 17a, at minimum, fills a space between a pair of the first sealing materials 16. The pair of substrates is fixed by the first sealing materials 16, which are disposed surrounding the pixel portion, and by the second sealing material 17a, which contacts the first sealing materials and covers the pixel portion.

Further, the second sealing material 17a is a colorless, transparent material and does not contain the gap material. It therefore has higher transmittivity of light than the first sealing materials 16. The second sealing material 17a is exposed in gaps, or openings, between the first sealing materials, and has the top surface shape in which the circumference of the exposed second sealing material 17a has a curved shape.

Figure 2A:
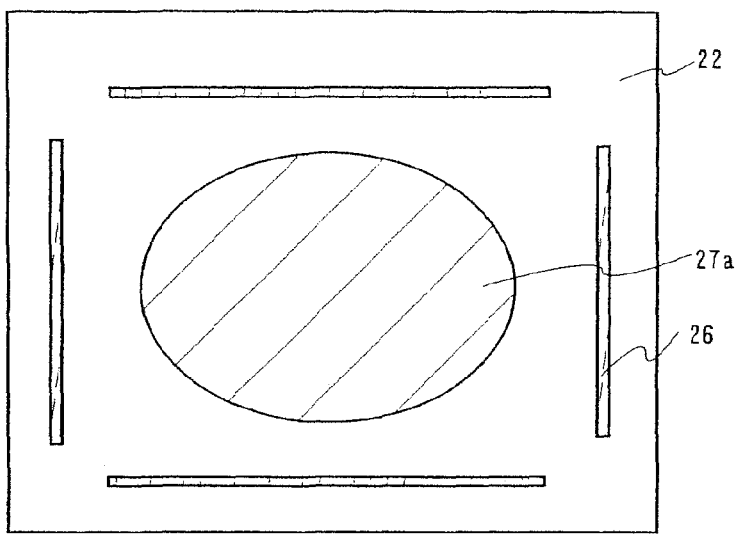
FIGS. 2A and 2B are diagrams showing Embodiment Mode 1.

A mechanism for the second sealing material 17a to take on the shape shown in FIG. 1A will be explained below using FIGS. 2A and 2B. An example of a top view of a scaling substrate (a second substrate 22) before bonding is shown in FIG. 2A. An example of forming a light emitting device having one pixel portion from a pair of substrates is shown in FIG. 2A.

Four first sealing materials 26 are formed first on the second substrate 22 by using a dispenser, after which a second sealing material 27a having a lower viscosity than that of the first sealing material is dripped thereon. Note that a top view of the second substrate with the second sealing material having dripped thereon corresponds to FIG. 2A.

A first substrate, on which a pixel portion 23 having light emitting elements, or a driver circuit portion 24, and a terminal portion 25 are formed, is then bonded to the second substrate. A top view immediately after bonding the pair of substrates is shown in FIG. 2B. The viscosity of the first sealing material is high, and therefore it spreads out very little upon bonding. The viscosity of the second sealing material is low, however, and the second sealing material spreads out planarly upon bonding, as shown in FIG. 2B. The second sealing material is pushed out between the first sealing materials 26, that is, in the direction of an arrow in FIG. 2B, toward an opening portion. Air bubbles can thus be kept from existing in a region between the first sealing materials 26, which is filled by the second sealing material. The first sealing material 26 does not mix with a second sealing material 27b, even if there is contact, and the first sealing material 26 has a viscosity such that the position at which it is formed is not changed by the second scaling material 27b.

Figure 2B:
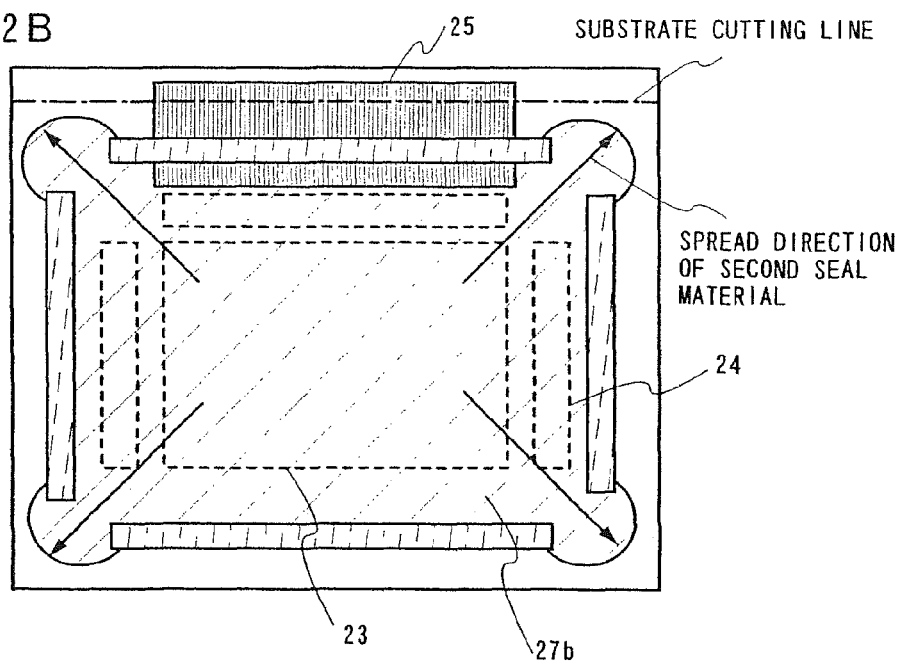
Figure 4A:
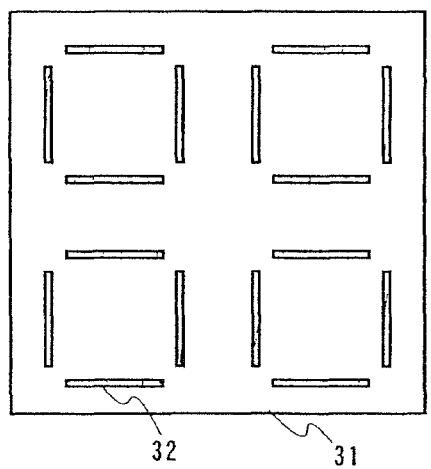
FIGS. 4A to 4E are diagrams showing Embodiment Mode 3.
Figure 4B:
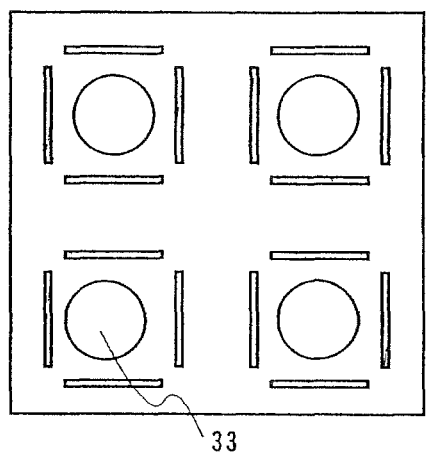
Figure 4C:
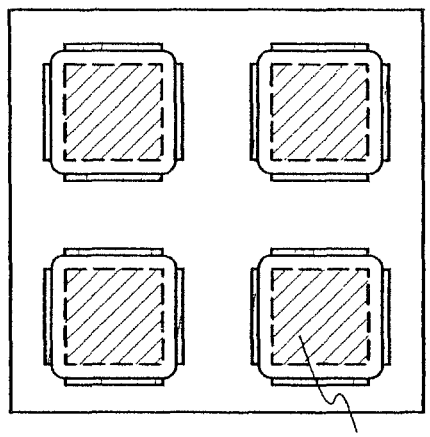
Figure 4D:
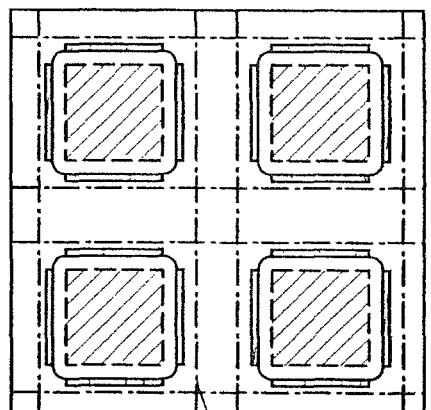
Figure 4E:
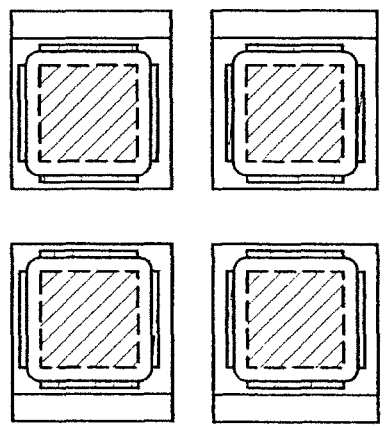

The second sealing material 27b is exposed in the openings in FIG. 2B, and the circumference of the exposed second sealing material 27 protrudes out from the openings. The distance between the ambient atmosphere and the pixel portion can be made larger by the second sealing material 27b protruding out from the openings, and in addition, oxygen and moisture can be blocked. Further, the total contact surface area is also increased, and therefore the bonding strength also increases. Further, the circumference of the second sealing material 27b is curved in the openings.

Note that an example of bonding the substrates after forming the first sealing materials or the second sealing material on the second substrate 22 is shown here, but the present invention is not limited to this structure in particular. The first sealing materials or the second sealing material may also be formed on the first substrate, on which elements are formed.

The first sealing materials 26 and the second sealing material 27b are then cured by performing heat treatment or ultraviolet light irradiation.

Portions of the second substrate 22 are sectioned next. Lines shown by dashed line segments in FIG. 2B become substrate cutting lines. The cutting lines may be set parallelly along the first sealing materials formed on the terminal portion 25 upon sectioning.

The shape of the second scaling material 17a shown in FIG. 1A can thus be obtained in accordance with the procedures shown above.

Further, although an example in which the second sealing material 17a protrudes out from the openings is shown in FIG. 1A, various other shapes can also be made by suitably changing the viscosity of, amount of, or material used in the second sealing material.

Figure 1B:
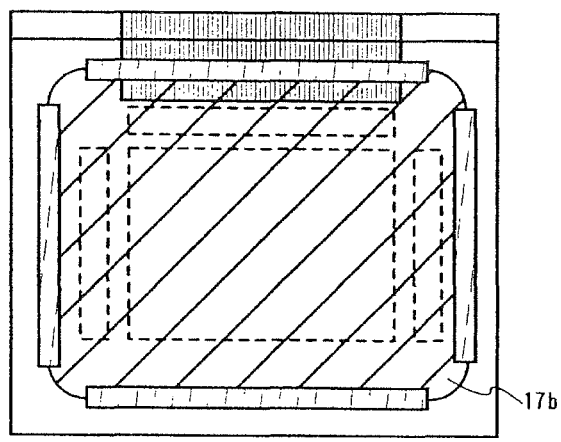

For example, a second scaling material 17b may be exposed in the openings, and the circumference of the exposed second sealing material may be curved as shown in FIG. 1B. The second sealing material does not protrude out from the openings in FIG. 1B. The circumference of the second sealing material takes on a shape in which it fills the gaps of the first sealing materials, tracing an arc.

Figure 1C:
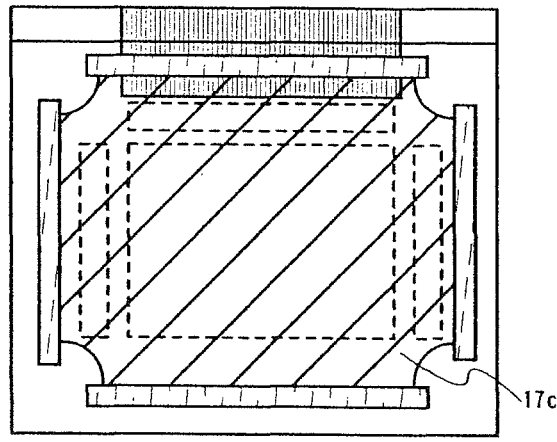

Further, a second sealing material 17c may be exposed in the openings, and the circumference of the exposed second scaling material may be curved, depressed inwardly from the opening portions, as shown in FIG. 1C.

Figure 6:
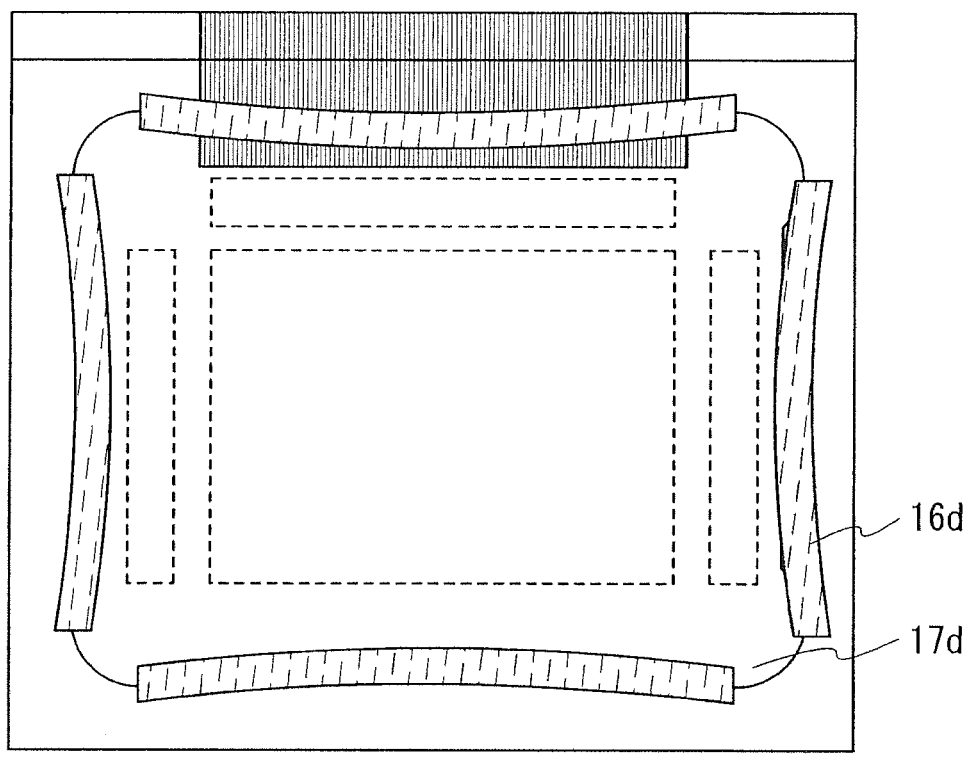
FIG. 6 is a diagram showing Embodiment Mode 1.

Further, the first sealing materials are not limited to a linear shape, provided that they have bilateral symmetry and that they are disposed symmetrically, sandwiching the pixel portion. For example, the shape of the first sealing materials may be curved slightly so that the low viscosity second sealing material will spread out easily upon bonding, as shown in FIG. 6. In FIG. 6, reference numeral 16d denotes first sealing materials and reference numeral 17d denotes a second sealing material.

Embodiment Mode 2

A portion of a cross sectional structure of a pixel portion of the present invention is shown here in FIG. 3A.

In FIG. 3A, reference numeral 300 denotes a first substrate, reference numerals 301a and 301b denote insulating layers, reference numeral 302 denotes a TFT, reference numeral 308 denotes a first electrode, and reference numeral 309 denotes an insulator. Reference numeral 310 denotes an EL layer, reference numeral 311 denotes a second electrode, reference numeral 312 denotes a transparent protective layer, reference numeral 313 denotes a second sealing material, and reference numeral 314 denotes a second substrate.

The TFT 302 (p-channel TFT) formed on the first substrate 300 is an element for controlling current flowing in the light emitting EL layer 310, and reference numeral 304 denotes a drain region (or a source region) thereof. Further, reference numeral 306 denotes a drain electrode (or a source electrode) that connects a first electrode and the drain region (or the source region). Further a wiring 307, such as an electric power source line or a source wiring, is formed at the same time as the drain electrode 306, using the same process. An example in which the first electrode and the drain electrode are formed separately is shown here, but they may also be formed at the same time. An insulating layer 301a that becomes a base insulating film (a nitride insulating film as a lower layer, and an oxide insulting film as an upper layer here) is formed on the first substrate 300, and a gate insulating film is formed between a gate electrode 305 and an active layer. Further, reference numeral 301b denotes an interlayer insulating film made from an organic material or an inorganic material. Further, although not shown here, an additional TFT (n-channel TFT or p-channel TFT), or a plurality of TFTs, may also be formed in one pixel. Furthermore, although a TFT having one channel forming region 303 is shown here, the present invention is not limited in particular to this, and a TFT having a plurality of channels may also be used.

Further, the reference numeral 308 denotes the first electrode, that is, an anode (or a cathode) of an OLED. A film of an element selected from the group consisting of Ti, TiN, $TiSi_xN_y$, Ni, W, $WSi_x$, $WN_x$, $WSi_xN_y$, NbN, Mo, Cr, Pt, Zn, Sn, In, and Mo, or a film of an alloy material or a chemical compound material having one of these elements as its main constituent, or a laminate film of such films, may be used as the first electrode 308 material at a total film thickness in a range of 100 nm to 800 nm. A titanium nitride film is used as the first electrode 308 here. It is preferable to increase the work function by irradiating ultraviolet light or performing plasma processing using chlorine gas over the surface, when using a titanium nitride film as the first electrode 308.

Further, the insulator 309 (also referred to as a bank, a sidewall, a barrier, an embankment, and the like) covers an edge portion of the first electrode 308 (and the wiring 307). Inorganic materials (such as silicon oxide, silicon nitride, and silicon oxynitride), photosensitive organic materials and non-photosensitive organic materials (such as polyimide, acrylic, polyamide, polyimide amide, resist, and benzocyclobutene), laminates of these materials, and the like can be used as the insulator 309. A photosensitive organic resin covered by a silicon nitride film is used here. It is preferable to provide a curved surface having a radius of curvature only in an upper edge portion of the insulator when using a positive type photosensitive acrylic as the organic resin material, for example. Further, negative type photosensitive organic materials, which become insoluble in etchants by exposure to light, and positive type photosensitive organic materials, which become soluble in etchants by exposure to light, can be used as the insulator.

Furthermore, a layer 310 that contains an organic compound is formed by using an evaporation method or an application method. Note that it is preferable to perform vacuum heat treatment before forming the layer 310 that contains the organic compound, thus performing degassing, in order to improve reliability. For example, if an evaporation method is used, evaporation is performed in a film formation chamber that has been vacuum evacuated to a pressure equal to or less than $5 \times 10^{-3}$ Torr (0.665 Pa), preferably between 10 and $10^{-4}$ Pa. The organic compound is gasified in advance by resistive heating when performing evaporation, and is dispersed toward the substrate by opening a shutter at the time of evaporation. The gasified organic compound is dispersed upward, and is deposited on the substrate after passing through an opening portion formed in a metal mask.

For example, a white color can be achieved by laminating $Alq_3$, $Alq_3$ into which Nile red, which is a red color light emitting pigment, is partly doped, $Alq_3$, p-EtTAZ, and TPD (aromatic diamine) in order using the evaporation method.

Further, if the layer containing the organic compound is formed by an application method that uses spin coating, it is preferable to fire the layer by using vacuum heat treatment after its application. For example, an aqueous solution of poly-(ethylene dioxythiophene) and poly-(styrene sulfonic acid) (PEDOT/PSS), which acts as a hole injecting layer, may be applied over the entire surface and fired. A solution of polyvinylene carbazole (PVK) doped with a luminescence center pigment (1,1,4,4-tetraphenyl-1,3-butadiene (TPB), 4-dicyanomethylene-2-methyl-6-(p-dimethylamino-styryl)-4H-pyran (DCM1), Nile red, Coumarin 6, or the like), which acts as a light emitting layer, may then be applied over the entire surface and fired. Note that water is used as a solvent for PEDOT/PSS, which does not dissolve in organic solvents. Consequently, there is no danger of re-dissolution if PVK is applied thereupon. Further, the solvents used for PEDOT/PSS and PVK are different, and therefore it is preferable that one film formation chamber be not used for both. Furthermore, the layer 310 containing an organic compound can be formed as a single layer, and 1,3,4-oxadiazole derivative (PBD), which has electron transporting characteristics, may be dispersed in polyvinyl carbazole (PVK), which has hole transporting characteristics. In addition, white color luminescence can be obtained by dispersing 30 wt % of PBD as an electron transporting agent, and dispersing a suitable amount of four types of pigments (TPB, Coumarin 6, DCM1, and Nile red).

Further, reference numeral 311 denotes the second electrode made from a conductive film, that is, an OLED cathode (or anode). A film of an alloy such as MgAg, MgIn, AlLi, CaF$_2$, and CaN, or a film having transmittivity and formed by co-evaporation of aluminum with an element residing in group 1 or group 2 of the periodic table, may be used as the second electrode 311 material. A top emission type light emitting device that emits light that passes through the second electrode is manufactured here, and therefore a 1 nm to 10 nm thick aluminum film, or an aluminum film that contains a minute amount of Li is used. It becomes possible to form the material contacting the layer 310, which contains an organic compound, by using a material other than an oxide if a structure using an Al film is employed as the second electrode 311, and the reliability of the light emitting device can be increased. Further, a layer (film thickness 1 nm to 5 am) having transmittivity and made from CaF$_2$, MgF$_2$, or BaF$_2$ may also be formed as a cathode buffer layer before forming the 1 nm to 10 nm aluminum film.

Further, a supplemental electrode may also be formed on the second electrode 311, in a region that does not become a light emitting region, in order to make the cathode have lower resistance. Furthermore, the cathode may be formed selectively by using a resistive heating method in accordance with evaporation, and using an evaporation mask, upon cathode formation.

Further, reference numeral 312 denotes the transparent protective layer formed by evaporation, which protects the second electrode 311 that is made from a metallic thin film. In addition, the transparent protective layer 312 is covered by a second sealing material 313. The second electrode 311 is an extremely thin metallic film, and therefore oxidation and the like tend to develop easily with exposure to oxygen. There is a fear in that the second electrode 311 will react with solvents contained in the sealing materials, changing its properties. Reaction of the second electrode 311 with solvents and the like contained in the second sealing material 313 is prevented by covering the second electrode 311, which is made from this kind of metallic thin film, with the transparent protective layer 312, for example, CaF$_2$, MgF$_2$, or BaF$_2$. Oxygen and moisture can also be effectively blocked at the same time, without using a drying agent. Further, it is possible to form CaF$_2$, MgF$_2$, and BaF$_2$ by evaporation. Impurity mix-in can be prevented, along with exposure of the electrode surface to the ambient atmosphere, by forming the cathode and the transparent protective layer in succession by using evaporation. In addition, the transparent protective layer 312 can be formed while imparting almost no damage to the layer containing the organic compound if evaporation is used. The second electrode 311 may also be further protected by forming layers having transmittivity, made from CaF$_2$, MgF$_2$, or BaF$_2$, on and under the second electrode 311, thus sandwiching it.

Further, a region between the first electrode and the second electrode can maintain a non-oxygen state with a concentration as close to zero as possible, by using a metal (high work function material) having no oxygen atoms in its molecular structure, a tantalum nitride film, for example, as the first electrode, by using a metal (low work function material) having no oxygen atoms in its molecular structure, an aluminum thin film, for example, as the second electrode, and in addition, by covering these with CaF$_2$, MgF$_2$, or BaF$_2$.

Figure 8:
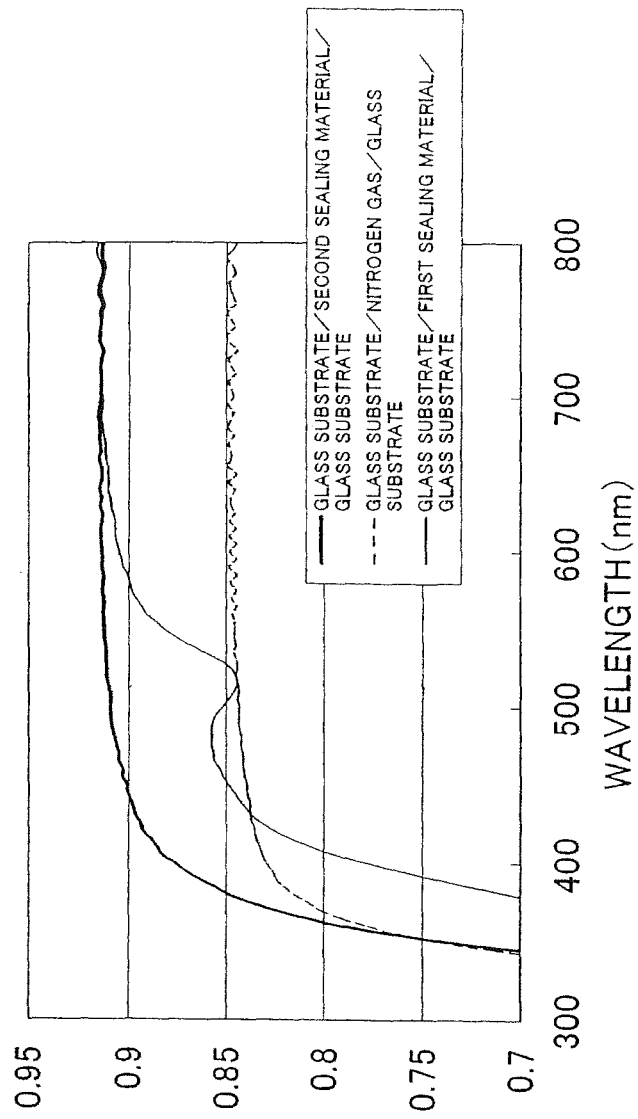
FIG. 8 is a diagram showing transmittivity of scaling materials.

Further, the second sealing material 313 bonds the second substrate 314 and the first substrate 300 by the method shown in Embodiment Mode 1. There are no particular limitations placed on the material for the second sealing material 313, provided that it is a material having light transmitting properties, and ultraviolet curing epoxy resins and thermal curing epoxy resins are typically used. A highly heat resistant UV epoxy resin (product name 2500 Clear, manufactured by Electrolite Cooperation) having an index of refraction equal to 1.50, a viscosity equal to 500 cps, a Shore D hardness equal to 90, a tensile strength equal to 3,000 psi, a Tg point of 150° C., a volumetric resistivity equal to $1 \times 10^{15}$ Ω·cm, and a withstand voltage of 450 V/mil is used here. Further, the overall transmittivity can be raised by filling the second sealing material 313 between the pair of substrates. The transmittivity was found for the following cases: when the second sealing material fills the space between a pair of glass substrates; when the first sealing material fills the space between a pair of glass substrates; and when nitrogen gas fills the space between a pair of substrates. As shown in FIG. 8, the transmittivity when the second sealing materials fills the space between the pair of glass substrates shows a value equal to or greater than 90% in a visible light region. Note that light transmittivity is shown in the vertical axis in FIG. 8, and wavelength is shown on the horizontal axis.

Further, a simplified form of the laminate structure in the light emitting region is shown in FIG. 3B. Emitted light is discharged in the direction of the arrow shown in FIG. 3B.

Further, emitted light can be discharged from both the top surface and the bottom surface if a first electrode 318 made from a transparent conductive film as shown in FIG. 3C is used as a substitute for the first electrode 308 made from a metallic layer. ITO (indium tin oxide alloy), an alloy of indium oxide and zinc oxide (In$_2$O$_3$, —ZnO) zinc oxide (ZnO), and the like may be used as the transparent conductive film.

Further, this embodiment mode can be freely combined with Embodiment Mode 1.

Embodiment Mode 3

A case of forming a plurality of pixel portions on one substrate, that is, an example of multiple patterns, is shown in FIGS. 4A to 4E.

An example of forming four panels using one substrate is shown here.

Figure 9:
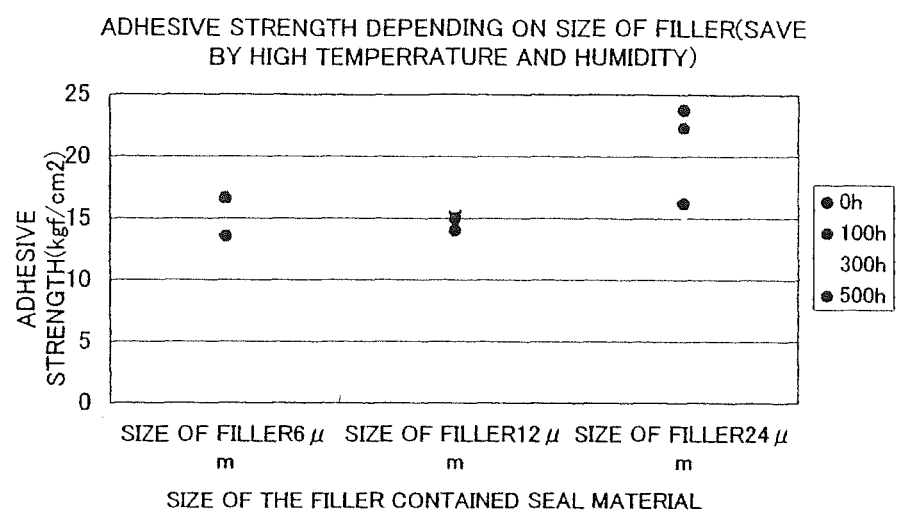
FIG. 9 is a diagram showing a relationship between filler diameter and adhesive strength.

First sealing materials 32 are formed first in a predetermined location on a second substrate 31 by using a dispenser apparatus under an inert gas atmosphere. (See FIG. 4A.) A material that contains a filler (diameter 6 μm to 24 μm) and having a viscosity of 370 Pa·s is used as a translucent sealing material for the first sealing materials 32. Further, data that shows the relationship between the size of the filler contained in the sealing material and the adhesive strength is shown in FIG. 9. Furthermore, the first sealing material 32 can be formed by print process because it has a simple sealing pattern. Next, a transparent second sealing material 33 is dripped on the region surrounded by the first sealing materials 32 (with openings in four corners) (see FIG. 4B).

Furthermore, a highly heat resistant UV epoxy resin (product name 2500 Clear, manufactured by Electrolite Cooperation) having an index of refraction of 1.50 and a viscosity of 500 cps is used here.

The first substrate, on which pixel portions 34 are formed, and the second substrate, on which the sealing materials are formed, are then bonded. (See FIG. 4C.) Note that it is preferable to perform annealing in a vacuum immediately before bonding the pair of substrates by using the sealing materials, thus performing degasification. The second sealing material 33 spreads out so as to form a shape like that shown in FIG. 1B, and is made to fill a space between the first sealing materials 32. Depending upon the shape and the arrangement of the first sealing materials 32, the second sealing material 33 can be made to fill the space without the introduction of air bubbles. Ultraviolet light irradiation is performed next, curing the first sealing materials 32 and the second sealing material 33. Note that heat treatment may also be performed in addition to ultraviolet light irradiation.

Scribe lines 35, shown by dashed lines, are formed next by using a scriber apparatus. (See FIG. 4D.) The scribe lines 35 may be formed along the first sealing materials.

The substrate is sectioned next using a breaker apparatus. (See FIG. 4E.) Four panels can thus be manufactured from one substrate.

Further, this embodiment mode can be freely combined with Embodiment Mode 1 or Embodiment Mode 2.

A further detailed explanation of the present invention, which has the above structure, will be given by the embodiments shown below.

EMBODIMENTS

Embodiment 1

One example of a light emitting device that has a light emitting element including an organic compound layer as a light emitting layer will be described in this embodiment with reference to FIG. 5.

FIG. 5A is a top surface view of a light emitting device and FIG. 5B is a cross-sectional view of FIG. 5A taken along the line A-A. A dotted line 1101 is a source signal line driving circuit, 1102 is a pixel portion, and 1103 is a gate signal line driving circuit. Reference numeral 1104 is an enclosing substrate and 1105 is a sealing agent. Inside enclosed by the first sealing agent 1105 is filled with a second transparent sealant 1107. The second sealant 1107 is exposed at four corners.

Reference numeral 1108 is a source signal line driving circuit and a wiring for transmitting signals inputted to the gate signal line driving circuit 1103, and receives a video signal and a clock signal from FPC 1109 as an external input terminal. Though only FPC is shown here, a print wiring board (PWB) may be attached to the FPC. A light emitting device in this specification includes not only a light emitting device body but also a light emitting device to which FPC or PWB are attached.

Next, the cross sectional structure will be explained with reference to FIG. 5B. A driving circuit and a pixel portion are formed on the substrate 1110. Here, the source signal line driving circuit 1101 as a driving circuit and the pixel portion 1102 are formed.

CMOS circuit is formed as a source signal line driver circuit 1101 by combining an n-channel TFT 1123 and a p-channel TFT 1124. The TFT forming a driving circuit may be formed of known CMOS circuit, PMOS circuit, or NMOS circuit. This embodiment shows a built-in driver that a driving circuit is formed on a substrate, but not limited thereto. The driving circuit can be formed not on the substrate but at exterior portion thereof.

The pixel portion 1102 is composed of a plurality of pixels including a switching TFT 1111, a current control TFT 1112, and a first electrode (anode) 1113 connected electrically to a drain of the current control TFT 1112.

Since a first electrode 1113 contacts directly to a drain of the TFT, the bottom layer of the first electrode 1113 is formed of a material that is made from silicon that can be an ohmic contact to the drain. The surface of the first electrode 1113 that contacts to an organic compound layer is preferable to be made from a material that has the large work function. When the first electrode is formed of three-laminated structure, for example, a titanium nitride film, an aluminum-based film, and a titanium nitride film, the first electrode can suppress resistance as a wiring low, be a good ohmic contact to the drain, and function as an anode. In addition, the first electrode 1113 can be formed either of a single layer of a titanium nitride film or a laminated structure of three or more layers.

Further, an insulator (referred to as a bank, a barrier, or the like) 1114 is formed on both ends of the first electrode (anode) 1113. The insulator 1114 may be made from an organic resin film or an insulating film containing silicon. Here, a positive photosensitive acrylic resin film is used for forming the insulator 1114 as shown in FIG. 5. The insulator 1114 may be covered with a protective film made from an aluminum nitride film, an aluminum oxynitride film, or silicon nitride film. The protective film is an insulating film that is made from silicon nitride or silicon oxynitride as major components by DC sputtering or RF sputtering, or a thin film that is made from carbon as major components. When a silicon target is used for forming the protective film in an atmosphere containing nitride and argon, a silicon nitride film can be formed. Or a silicon nitride target can also be used. The protective film can be formed by using a deposition device using remote plasma. It is preferable that the thickness of the protective film is formed to be thin as much as possible in order for light to pass therethrough.

An organic compound layer 1115 is selectively formed by evaporation using evaporation mask or ink-jet on the first electrode (anode) 1113. A second electrode (cathode) 1116 is formed on the organic compound layer 1115. Consequently, the first electrode (anode) 1113, an organic compound film 1115, and a light emitting element 1118 formed of the second electrode (cathode) 1116. Since an example that the light emitting element emits white light is shown here, a color filter formed of a coloring layer 1131 and BM 1132 (for ease of illustration, an over coat layer is not shown) is provided.

If organic compound layers that can achieve R, G, B luminescence are formed respectively, full color display can be realized without color filter.

In order for the light emitting element 1118 on the substrate 1110 to be encapsulated, an enclosing substrate 1104 is adhered using a first sealant 1105 and a second sealant 1107. Preferred material for the first sealant 1105 and the second sealant 1107 is epoxy resin. It is preferable that the first sealant 1105 and the second sealant 1107 do not penetrate moisture or oxygen as much as possible.

In this embodiment, for the enclosing substrate 1104, a plastic substrate made from FRP (Fiberglass-Reinforced Plastics), PVF (polyvinylfluoride), Mylar, polyester, acrylic, or the like can be used besides a glass substrate or a quarts substrate. After the enclosing substrate is adhered using the first sealant 1105 and the second sealant 1107, third sealant can be used for adhering the enclosing substrate 1104 to cover the side faces (exposed faces).

Encapsulation of the light emitting element 1118 using the first sealant 1105 and the second sealant 1107 can cut it off absolutely from the outside and prevent moisture or oxygen that cause deterioration of an organic compound layer from penetrating. Therefore the high reliable light emitting device can be fabricated.

This embodiment can be freely combined with any of Embodiment Mode 1 to 3.

Embodiment 2

In this embodiment, a different cross-sectional structure from that of Embodiment Made 2 is shown in FIG. 7.

Figure 7A:
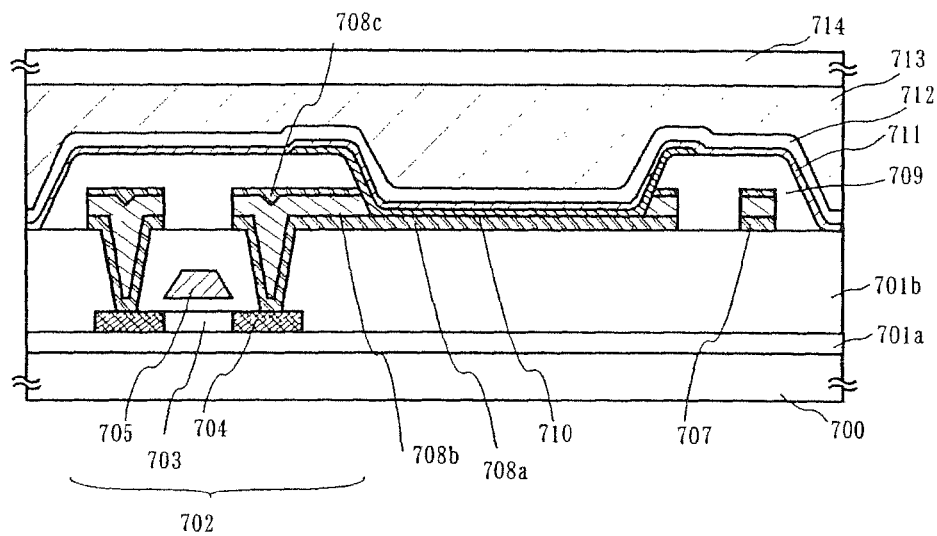
FIGS. 7A and 7B are diagrams showing Embodiment 2.

In FIG. 7A, reference numeral 700 is a first substrate, 701a, 701b are insulating layers, 702 is a TFT, 710 is an EL layer, 711 is a second electrode, 712 is a transparent protective layer, 713 is a second sealant, and 714 is a second substrate.

A TFT 702 (p-channel TFT) formed on a substrate 700 controls current that is flowing through EL layer 710 for emitting light. Reference numeral 704 is a drain region (or a source region). Reference numeral 705 is a gate electrode. Though not shown here, one or more TFT (n-channel TFT or p-channel TFT) or plural TFTs are provided to one pixel. Here, a TFT having one channel forming region 703 is illustrated, but not limited thereto, the TFT can have a plurality of channels.

FIG. 7A shows a structure in which a first electrodes 708a to 708c made from laminate of metallic layers are formed, then, after an insulator 709 (also referred to as a bank, barrier, or the like) for covering both ends of the first electrode is formed, etching is conducted in a self-aligning manner using the insulator 709 as a mask, and then, a center portion of the first electrode is etched thinly to form steps at both ends thereof with etching a part of the insulator. By this etching, a center portion of the first electrode is made thin and flat, and both ends portion of the first electrode are made thick, that is, a concave shape. Then, an organic compound layer 710 and a second electrode 711 are formed on the first electrode to complete the light emitting element.

The structure shown in FIG. 7A is for increasing an amount of emission that is extracted a certain direction (in the direction through the second electrode) by reflecting or condensing the light in the lateral direction by a slope formed in the step portions of the first electrode.

Thus, a slope portion 708b is preferable to be made from metal that reflects light, for example, materials made form aluminum or silver as major components. A center portion 708a is preferable to be made from an anode material having large work function or a cathode material having small work function. Since wiring 707 such as a power supplying light or a source wiring is formed simultaneously, low resistance material is preferable to be selected.

A preferable angle of gradient (also referred to as a taper angle) is more than 50° and less than 60°, more preferably, 54.7°. In order for the light reflected by a slope face of the first electrode not to be dispersed or strayed, an angle of gradient, a material and a thickness of an organic compound layer, or a material and a thickness of the second electrode needs to be set appropriately.

In this embodiment, reference numeral 708a is a lamination of titanium film (60 nm in thick) and a titanium nitride film (100 nm in thick), 708b is an aluminum film containing Ti slightly (350 nm in thick), and 708c is a titanium film (100 nm in thick). 708c protects 708b to prevent hillock or deterioration of the aluminum film. Or a titanium nitride film may be used as 708c to give it light shielding property and prevent reflection of an aluminum film. In order for 708a to be good ohmic contact to 704 made from silicon, a titanium film is used for the bottom layer of 708a, however it is not limited thereto, another metallic films can be used. 708a can be formed of a single layer of a titanium nitride film.

UV treatment or plasma treatment is needed because a titanium nitride film is used as an anode in this embodiment. However, plasma treatment is conducted to a surface of the titanium nitride film simultaneously with conducting etching to 708b, 708c, thereby the titanium nitride film can be obtained large work function as an anode.

Anode materials that can be substitution of a titanium nitride film are an element selected from Ni, W, $WSi_x$, $WN_x$, $WSi_xN_y$, NbN, Mo, Cr, Pt, Zn, Sn, In, or Mo, an alloy material, or compound material that is composed of above elements as a major component. A film or a laminated film that is made from above elements or materials can be used in the total thickness range of 100 nm to 800 nm.

In the structure shown in FIG. 7A, since etching is conducted in a self-aligning manner using the insulator 709 as a mask, there is no need to add more masks. Thus a top emitting structure light emitting device can be fabricated with a few masks and steps collectively.

Figure 7B:
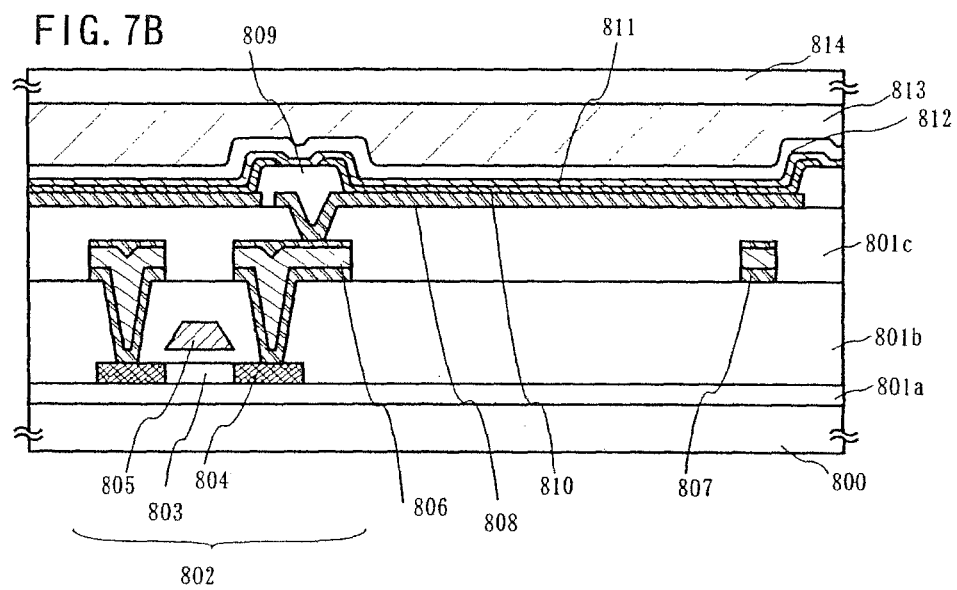

FIG. 7B shows a different structure from that of FIG. 7A. An insulating layer 801c is used as an interlayer insulating film, and the first electrode and a drain electrode (or a source electrode) are provided at different layers. Consequently, the number of masks is increasing but the luminous area can be enlarged.

In FIG. 7B, reference numeral 800 is a first electrode, 801a, 801b, and 801c are insulating layers, 802 is a TFT (a p-channel TFT), 803 is a channel forming region, 804 is a drain region (or a source region), 805 is a gate electrode, 806 is a drain electrode (or a source electrode, 807 is a wiring, 808 is a first electrode, 809 is an insulator, 810 is an EL layer, 811 is a second electrode, 812 is a transparent protective layer, 813 is a second sealant, and 814 is a second substrate.

If a transparent conductive film is used as the first electrode 808, both top and bottom emitting structure light emitting device can be fabricated.

This embodiment can be freely combined with any of Embodiment Mode 1 to 3, and Embodiment 1.

Embodiment 3

By implementing the present invention, all of electronic apparatus integrated with a module having an organic compound layer (active matrix type EL module, passive matrix EL module) are completed.

As such electronic apparatus, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 10 and 11 show examples of these.

FIG. 10A is a personal computer which includes a main body 2001, an image input portion 2002, a display portion 2003 and a keyboard 2004.

FIG. 10B is a video camera which includes a main body 2101, a display portion 2102, a voice input portion 2103, an operation switch 2104, a battery 2105, an image receiving portion 2106.

FIG. 10C is a mobile computer which includes a main body 2201, a camera portion 2202, an image receiving portion 2203, an operation switch 2204 and a display portion 2205.

FIG. 10D is a goggle type display which includes a main body 2301, a display portion 2302 and an arm portion 2303.

FIG. 10E is a player using a record medium recorded with programs (hereinafter, referred to as record medium) which includes a main body 2401, a display portion 2402, a speaker portion 2403, a record medium 2404 and an operation switch 2405. Further, the player uses DVD (Digital Versatile Disc) or CD as a record medium and can enjoy music, enjoy movie and carry out the game or Internet.

FIG. 10F is a digital camera which includes a main body 2501, a display portion 2502, an eye-piece portion 2503, an operation switch 2504 and an image receiving portion (not illustrated).

Figure 11A:
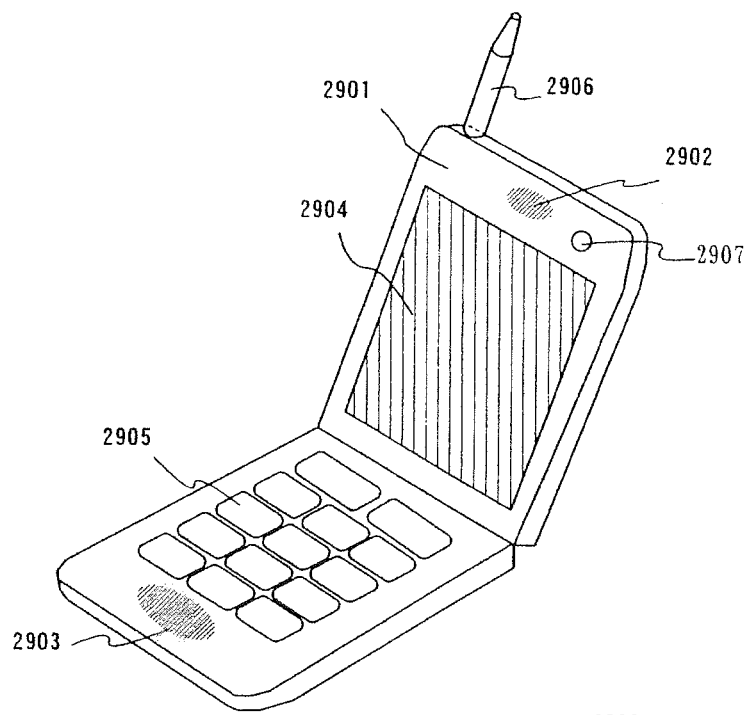
FIGS. 11A to 11C are diagrams showing examples of electronic equipment (Embodiment 3).

FIG. 11A is a portable telephone which includes a main body 2901, a voice output portion 2902, a voice input portion 2903, a display portion 2904, an operation switch 2905, an antenna 2906 and an image input portion (CCD, image sensor) 2907.

Figure 11B:
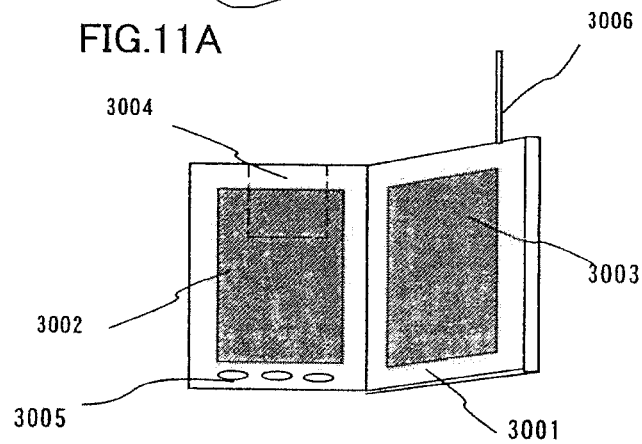

FIG. 11B is a portable book (electronic book) which includes a main body 3001, display portions 3002, 3003, a record medium 3004, an operation switch 3005, an antenna 3006.

Figure 11C:
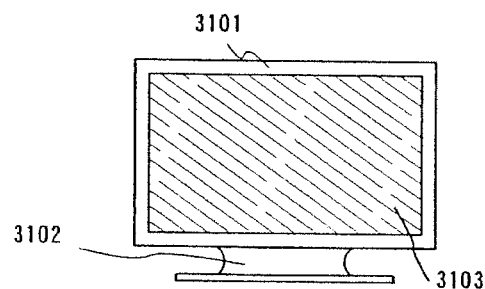

FIG. 11C is the display which includes a main body 3101, a support base 3102 and a display portion 3103.

Incidentally, the display shown in FIG. 11C is of a screen size of middle or small type or large type, for example, a screen size of 5 to 20 inches. Further, in order to form the display portion of this size, it is preferable to use a display portion having a side of a substrate of 1 m and carry out mass production by taking many faces. As described above, the range of applying the present invention is extremely wide and is applicable to a method of fabricating electronic apparatus of all the fields. Further, the electronic apparatus of the embodiment can be realized by using a constitution comprising any combination of Embodiment Modes 1 to 3 and Embodiments 1 and 2.

In accordance with the present invention, a transparent sealing material can be made to fill a space, without containing air bubbles, upon bonding of a pair of substrates. A light emitting device having high reliability can therefore be obtained.

Further, a region between a first electrode and a second electrode can maintain a non-oxygen state with a concentration as close to zero as possible by using a metal (high work function material) having no oxygen atoms in its molecular structure, a tantalum nitride film, for example, as the first electrode, by using a metal (low work function material) having no oxygen atoms in its molecular structure, an aluminum thin film, for example, as the second electrode, and in addition, by covering these with $CaF_2$, $MgF_2$, or $BaF_2$. A light emitting device with high reliability can therefore be obtained.

What is claimed is:

1. A display device comprising:
   a first substrate;
   a pixel portion including a plurality of light emitting elements over the first substrate;
   a second substrate over the first substrate and the pixel portion
   a first sealing material provided between the first substrate and the second substrate and surrounding the pixel portion, wherein the first sealing material has a first end, a second end, and an opening between the first end and the second end; and
   a second sealing material provided on the inside of the first sealing material and covering the pixel portion,
   wherein a part of the second sealing material spreads out from the opening.

2. The display device according to claim 1, wherein the opening is not overlapping with the pixel portion.

3. The display device according to claim 1, wherein each of the plurality of light emitting elements comprises:
   a first electrode over the first substrate;
   a layer comprising an organic compound over the first electrode; and
   a second electrode over the layer comprising the organic compound.

4. The display device according to claim 1, wherein the second substrate has a plurality of color filters above the plurality of light emitting elements.

5. The display device according to claim 4, wherein the second sealing material is in contact with the plurality of color filters.

6. The display device according to claim 1, wherein the first sealing material contains a gap material that maintains a gap between the first substrate and the second substrate.

7. The display device according to claim 1, wherein light emitted from the plurality of light emitting elements passes through the second sealing material and the second substrate.

8. The display device according to claim 1, wherein light emitted from the plurality of light emitting elements passes through the second sealing material and the second substrate, and through the first substrate.

9. The display device according to claim 1, further comprising a driver circuit portion over the first substrate, the driver circuit portion covered with the second sealing material.

10. The display device according to claim 1, wherein the display device is incorporated in at least one selected from the group consisting of a video camera, a digital camera, a goggle-type display, a navigation system, a personal computer, a DVD player, an electronic play equipment, a portable information terminal, a portable telephone, an electronic book, and a display.

11. A display device comprising:
    a first substrate;
    a pixel portion including a plurality of light emitting elements over the first substrate;
    a second substrate over the first substrate and the pixel portion
    a first sealing material provided between the first substrate and the second substrate and surrounding the pixel portion, wherein the first sealing material has a first end, a second end, and an opening between the first end and the second end; and
    a second sealing material provided between the first substrate and the second substrate and covering the pixel portion, wherein the second sealing material is surrounded by the first sealing material,
    wherein a part of the second sealing material bulges out from the opening.

12. The display device according to claim 11, wherein the opening is not overlapping with the pixel portion.

13. The display device according to claim 11, wherein, each of the plurality of light emitting elements comprises:
    a first electrode over the first substrate;
    a layer comprising an organic compound over the first electrode; and
    a second electrode over the layer comprising the organic compound.

14. The display device according to claim 11, wherein the second substrate has a plurality of color filters above the plurality of light emitting elements.

15. The display device according to claim 14, wherein the second sealing material is in contact with the plurality of color filters.

16. The display device according to claim 11, wherein the first sealing material contains a gap material that maintains a gap between the first substrate and the second substrate.

17. The display device according to claim 11, wherein light emitted from the plurality of light emitting elements passes through the second sealing material and the second substrate.

18. The display device according to claim 11, wherein light emitted from the plurality of light emitting elements passes through the second sealing material and the second substrate, and through the first substrate.

19. The display device according to claim 11, further comprising a driver circuit portion over the first substrate, the driver circuit portion covered with the second sealing material.

20. The display device according to claim 11, wherein the display device is incorporated in at least one selected from the group consisting of a video camera, a digital camera, a goggle-type display, a navigation system, a personal computer, a DVD player, an electronic play equipment, a portable information terminal, a portable telephone, an electronic book, and a display.

21. A display device comprising:
a first substrate;
a pixel portion including a plurality of light emitting elements over the first substrate;
a second substrate over the first substrate and the pixel portion
a first sealing material provided between the first substrate and the second substrate and surrounding the pixel portion, wherein the first sealing material has a first end, a second end, and an opening between the first end and the second end;
a second sealing material provided on the inside of the first sealing material and covering the pixel portion; and
a connecting terminal configured to connect to an FPC over the first substrate, the connecting terminal provided outside the first sealing material and the second substrate,
wherein a part of the second sealing material protrudes from the opening.

22. The display device according to claim 21, wherein the opening is not overlapping with the pixel portion.

23. The display device according to claim 21, wherein, each of the plurality of light emitting elements comprises:
a first electrode over the first substrate;
a light emitting layer over the first electrode; and
a second electrode over the light emitting layer.

24. The display device according to claim 21, wherein the second substrate has a plurality of color filters above the plurality of light emitting elements.

25. The display device according to claim 24, wherein the second sealing material is in contact with the plurality of color filters.

26. The display device according to claim 21, wherein the first sealing material contains a gap material that maintains a gap between the first substrate and the second substrate.

27. The display device according to claim 21, wherein light emitted from the plurality of light emitting elements passes through the second sealing material and the second substrate.

28. The display device according to claim 21, wherein light emitted from the plurality of light emitting elements passes through the second sealing material and the second substrate, and through the first substrate.

29. The display device according to claim 21, further comprising a driver circuit portion over the first substrate, the driver circuit portion covered with the second sealing material.

30. The display device according to claim 21, wherein the display device is incorporated in at least one selected from the group consisting of a video camera, a digital camera, a goggle-type display, a navigation system, a personal computer, a DVD player, an electronic play equipment, a portable information terminal, a portable telephone, an electronic book, and a display.

* * * * *